US012476076B2

(12) United States Patent
Lee et al.

(10) Patent No.: US 12,476,076 B2
(45) Date of Patent: Nov. 18, 2025

(54) SUBSTRATE PROCESSING APPARATUS

(71) Applicant: PSK INC., Gyeonggi-do (KR)

(72) Inventors: Chi Young Lee, Gyeonggi-do (KR); A Ram Kim, Gyeonggi-do (KR); Soo Yeong Yang, Gyeonggi-do (KR); Young Tak Yoon, Gyeonggi-do (KR); Yun Young Lee, Gyeonggi-do (KR); Jin Chul Son, Gyeonggi-do (KR)

(73) Assignee: PSK INC., Gyeonggi-do (KR)

( * ) Notice: Subject to any disclaimer, the term of this patent is extended or adjusted under 35 U.S.C. 154(b) by 57 days.

(21) Appl. No.: 18/284,657

(22) PCT Filed: Dec. 16, 2021

(86) PCT No.: PCT/KR2021/019222
§ 371 (c)(1),
(2) Date: Sep. 28, 2023

(87) PCT Pub. No.: WO2022/211220
PCT Pub. Date: Oct. 6, 2022

(65) Prior Publication Data
US 2024/0194445 A1 Jun. 13, 2024

(30) Foreign Application Priority Data
Apr. 1, 2021 (KR) ........................ 10-2021-0042683

(51) Int. Cl.
*H01J 37/32* (2006.01)

(52) U.S. Cl.
CPC ........ *H01J 37/321* (2013.01); *H01J 37/3244* (2013.01); *H01J 37/32798* (2013.01); *H01J 2237/3323* (2013.01)

(58) Field of Classification Search
CPC ................. H01J 37/321; H01J 37/3244; H01J 37/32798; H01J 2237/3323
See application file for complete search history.

(56) References Cited

U.S. PATENT DOCUMENTS 5,731,565 A * 3/1998 Gates .................... H01J 37/321 219/121.52
6,417,626 B1 * 7/2002 Brcka ................... H01J 37/321 204/671

(Continued)

FOREIGN PATENT DOCUMENTS

JP 5554099 B2 6/2014
JP 6062461 B2 12/2016

(Continued)

OTHER PUBLICATIONS

International Search Report dated Mar. 31, 2022, in International Application No. PCT/KR2021/019222.

*Primary Examiner* — Adam D Houston
(74) *Attorney, Agent, or Firm* — Procopio, Cory, Hargreaves & Savitch, LLP

(57) ABSTRACT

Provided is an apparatus for processing a substrate, the apparatus including: a chamber having a processing space; a support unit for supporting a substrate in the processing space; a gas supply unit for supplying process gas to the processing space; and a plasma generation unit for generating plasma from the process gas, in which the plasma generation unit includes: an inner coil part including a plurality of inner coils; an outer coil part provided to surround the inner coil part when viewed from above and including a plurality of outer coils; an upper power source for applying power to the inner coil part and the outer coil part, and a ground plate disposed above the inner coil part and the outer coil part and grounding the inner coil part and the outer coil part.

20 Claims, 13 Drawing Sheets

(56) References Cited

U.S. PATENT DOCUMENTS

| | | | | |
|---|---|---|---|---|
| 10,170,279 | B2 * | 1/2019 | Kenney | H01J 37/321 |
| 10,249,470 | B2 * | 4/2019 | Kenney | H01J 37/04 |
| 10,325,758 | B2 * | 6/2019 | Yamawaku | H01J 37/32119 |
| 11,094,508 | B2 * | 8/2021 | Kao | C23C 16/52 |
| 2007/0186855 | A1 * | 8/2007 | Dhindsa | H01J 37/321 156/345.43 |
| 2007/0199658 | A1 * | 8/2007 | Dhindsa | H01J 37/32642 156/345.43 |
| 2011/0094996 | A1 * | 4/2011 | Yamazawa | H01J 37/3211 216/68 |
| 2012/0073757 | A1 * | 3/2012 | Yamazawa | H01J 37/3211 156/345.48 |
| 2015/0014276 | A1 * | 1/2015 | Yamazawa | H01J 37/3244 216/68 |
| 2020/0357606 | A1 | 11/2020 | Yamazawa et al. | |
| 2023/0207262 | A1 * | 6/2023 | Park | H01J 37/321 156/345.29 |
| 2023/0260752 | A1 * | 8/2023 | Yamazawa | H01J 37/3211 156/345.48 |
| 2025/0022682 | A1 * | 1/2025 | Okita | H01J 37/3211 |

FOREIGN PATENT DOCUMENTS

| | | | | | |
|---|---|---|---|---|---|
| KR | 102033873 | B1 | | 3/1999 | |
| KR | 100290813 | B1 | | 3/2001 | |
| KR | 1020120043591 | A | | 5/2012 | |
| KR | 1020150038130 | A | | 4/2015 | |
| KR | 101885102 | B1 | | 7/2018 | |
| KR | 20220045895 | A | * | 4/2022 | |
| TW | 201405627 | A | | 2/2014 | |
| TW | 201903888 | A | | 1/2019 | |
| WO | WO-2022081535 | A1 | * | 4/2022 | H01J 37/32091 |
| WO | WO-2023008805 | A1 | * | 2/2023 | H01J 37/3211 |
| WO | WO-2023128325 | A1 | * | 7/2023 | H01J 37/3211 |
| WO | WO-2025029558 | A1 | * | 2/2025 | |

* cited by examiner

SUBSTRATE PROCESSING APPARATUS

CROSS-REFERENCE TO RELATED APPLICATION

This patent application is a national phase entry of international patent application No. PCT/KR2021/019222 filed on Dec. 16, 2021, which claims the benefit of Korean patent application No. 10-2021-0042683 filed on Apr. 1, 2021, the disclosure of which is expressly incorporated herein by reference.

TECHNICAL FIELD

The present invention relates to an apparatus for processing a substrate, and more particularly, to a substrate processing apparatus for processing a substrate by using plasma.

BACKGROUND ART

Plasma refers to an ionized gas state formed of ions, radicals, electrons, and the like, and is generated by a very high temperature, strong electric fields, or RF electromagnetic fields. A semiconductor apparatus manufacturing process includes an ashing or etching process of removing a membrane on a substrate by using plasma. The ashing or etching process is performed when ions and radical particles contained in the plasma collide or react with the membrane on the substrate.

The plasma generation units that generate the plasma described above are broadly divided into a Capacitively Coupled Plasma (CCP) type and an Inductively Coupled Plasma (ICP) type. Among them, the ICP type includes an inner coil module 10, and an outer coil module 20, as shown in FIG. 1. The inner coil module 10 includes a first inner coil 11, and a second inner coil 12. The outer coil module 20 includes a first outer coil 21, a second outer coil 22, and a third outer coil 23. At one end of the first inner coil 11, a ground port 11*a* to which a ground line is connected and a power port 11*b* to which a power supply line is connected are formed. Similar to the first inner coil 11, a ground port 12*a* and a power port 12*b* are formed on the second inner coil 12. In addition, the first outer coil 21 and the second outer coil 22 are provided to surround the inner coil module 10 when viewed from above. The first outer coil 21 has a ground port 11*a* to which a ground line is connected and a power port 21*b* to which a power supply line is connected. Similar to the first outer coil 21, the second outer coil 22 also includes a ground port 22*a* and a power port 22*b*. Similar to the first outer coil 21, the third outer coil 23 is formed with a ground port 23*a* and a power port 23*b*. That is, the inner coil module 10 has two turns. The outer coil module 20 also has two turns. The inner coil module 10 and the outer coil module 20 receive power from a high frequency power source to generate plasma in a space in the chamber where a substrate, such as a wafer, is processed.

FIG. 2 is a graph of plasma density generated by the outer coils of FIG. 1 according to a distance from the center of a space in a chamber, and FIG. 3 is a graph of plasma density generated by the inner coils of FIG. 2 according to a distance from the center of the space in the chamber. In FIGS. 2 and 3, the variation of plasma density (PD) according to a distance from the center of the space in the chamber (for example, the center of a substrate placed in the chamber) is illustrated. FIGS. 2 and 3 illustrate plasma density PD along a first direction, plasma density PD along a second direction perpendicular to the first direction, and plasma density PD along a third direction and a fourth direction, respectively, which are angled 45 degrees with respect to the first direction and the second direction, when viewed from above.

As shown in FIGS. 2 and 3, the plasma density PD generated by the inner coils 11, 12 and outer coils 21, 22 is uneven from the center of the chamber to the left and right. This is because, given virtual lines drawn from the center of the chamber, one of the virtual lines, a first virtual line L1, passes only the first outer coil 21 among the first outer coil 21 to the third outer coil 23, while the other of the virtual lines, a second virtual line L2, passes the first outer coil 21 and the third outer coil 23. That is, the first and second outer coils 21 and 22 are structurally asymmetrical with respect to the space within the chamber. Similarly, the first and second inner coils 11 and 12 are also structurally asymmetrical with respect to the space within the chamber. In other words, due to the structural asymmetry of the coils, the density of the plasma generated in the space within the chamber is non-uniform. If the density of the plasma generated in the space within the chamber is uneven, the uniformity of processing to the substrate is also compromised.

Technical Problem

The present invention has been made in an effort to provide a plasma generation unit and a substrate processing apparatus, which are capable of efficiently processing a substrate.

The present invention has also been made in an effort to provide a plasma generation unit and a substrate processing apparatus, which are capable of improving uniformity of processing to a substrate.

The present invention has also been made in an effort to provide a plasma generation unit and a substrate processing apparatus, which are capable of securing a plasma density control range.

The problem to be solved by the present invention is not limited to the above-mentioned problems, and the problems not mentioned will be clearly understood by those skilled in the art from the present specification and the accompanying drawings.

Technical Solution

An exemplary embodiment of the present invention provides an apparatus for processing a substrate, the apparatus including: a chamber having a processing space; a support unit for supporting a substrate in the processing space; a gas supply unit for supplying process gas to the processing space; and a plasma generation unit for generating plasma from the process gas, in which the plasma generation unit includes: an inner coil part including a plurality of inner coils; an outer coil part provided to surround the inner coil part when viewed from above and including a plurality of outer coils; an upper power source for applying power to the inner coil part and the outer coil part, and each of the inner coils and each of the outer coils are provided to be concentric with each other, each of the inner coils and the outer coils has a first portion to an $n^{th}$ portion, and a first connection portion to an $n-1^{th}$ connection portion, and N is a natural number equal to or greater than 2, the first portion to the $n^{th}$ portion are each provided in a shape of an arc having a different radius with respect to the concentric point, the $k+1^{th}$ portion has a radius greater than the $k^{th}$ portion, the $k^{th}$ connection portion connects the $k^{th}$ portion to the $k+1^{th}$ portion, and the k is a natural number equal to or greater than 1 and equal to or less than n−1, any one of the first portion and the $n^{th}$ portion has a power terminal to which an electricity line receiving power from the power source is connected, the other of the first portion and the $n^{th}$ portion has a ground terminal connected with a ground line, and in each of the inner coils and the outer coils, the power terminal and the ground terminal are located on a straight line through the concentric point.

According to the exemplary embodiment, the ground terminal, the power terminal, and the concentric point may be sequentially disposed on the straight line.

According to the exemplary embodiment, a power terminal connected to one inner coil among the inner coils, a power terminal connected to one outer coil among the outer coils, and the concentric point may be disposed on the same line.

According to the exemplary embodiment, in any one inner coil among the inner coils or any one outer coil among the outer coils, the straight line through the concentric point may pass through only any one of the first portion and the $n^{th}$ portion.

According to the exemplary embodiment, each of the first connection portion and the $N-1^{th}$ connection portion may be provided to be inclined with respect to the straight line through the concentric point.

According to the exemplary embodiment, the n may be 3.

According to the exemplary embodiment, the inner coils and the outer coils may be each provided in the number of three.

According to the exemplary embodiment, the inner coils and the outer coils may be all disposed in the same plane.

According to the exemplary embodiment, each of the inner coils and the outer coils may have a center angle of 360 degrees, and the first portion to the $n^{th}$ portion may be each provided with the same center angle.

According to the exemplary embodiment, the apparatus may further include a ground plate disposed above the coil part, in which the ground terminal may be connected to the ground plate.

According to the exemplary embodiment, the chamber may include: a lower body; a cover combined with the lower body to form the processing space; an upper body combined with the cover to form an interior space in which the inner coil part and outer coil part are disposed; and a fan unit for supplying airflow to the interior space, and the ground plate is disposed in the interior space, and the ground plate is provided with an opening to allow the airflow to circulate in the interior space.

According to the exemplary embodiment, the fan unit may include: a first fan; and a second fan for supplying the airflow to the interior space at a position different from the first fan, and the opening is formed in the ground plate at a position overlapping the first fan and/or the second fan when viewed from above.

According to the exemplary embodiment, the inner coil and the outer coil may be provided from a material including at least one of copper, aluminum, tungsten, silver, gold, platinum, and iron.

According to the exemplary embodiment, surfaces of the inner coil and the outer coil may be coated with a material including at least one of silver, gold, and platinum.

According to the exemplary embodiment, the ground plate may be provided from a material including at least one of aluminum, copper, and iron.

Another exemplary embodiment of the present invention provides an apparatus for processing a substrate, the apparatus including: a chamber having a processing space; a support unit for supporting a substrate in the processing space; a gas supply unit for supplying process gas to the processing space; and a plasma generation unit for generating plasma from the process gas, in which the plasma generation unit includes: a coil part including a plurality of coils; and an upper power source for applying power to the coil part, each of the coils has a first portion to an $n^{th}$ portion and a first connection portion to an $n-1^{th}$ connection portion, and N is a natural number equal to or greater than 2, the first portion to the $n^{th}$ portion are provided in a form of arcs that are concentric with each other, among the first portion to the $n^{th}$ portion, the $k+1^{th}$ portion has a radius greater than the $k^{th}$ portion, the $k^{th}$ connection portion connects the $k^{th}$ portion to the $k+1^{th}$ portion, and the k is a natural number equal to or greater than 1 and equal to or less than n−1, any one of the first portion and the $n^{th}$ portion has a power terminal to which an electricity line receiving power from the power source is connected, the other of the first portion and the $n^{th}$ portion has a ground terminal connected with a ground line, and in each of the coils, the power terminal and the ground terminal are located on a straight line through the concentric point.

According to the exemplary embodiment, the ground terminal connected to any one coil among the coils, the power terminal, and the concentric point may be sequentially disposed on the straight line.

According to the exemplary embodiment, the straight line through the concentric point may pass through only any one of the first portion to the $n+1^{th}$ portion in any one of the coils.

Each of the first connection portion and the $N-1^{th}$ connection portion may be provided to be inclined with respect to the straight line through the concentric point.

According to the exemplary embodiment, the coils may be all disposed on the same plane.

Still another exemplary embodiment of the present invention provides an apparatus for processing a substrate, the apparatus including: a chamber having a processing space; a support unit for supporting a substrate in the processing space; a gas supply unit for supplying process gas to the processing space; and a plasma generation unit for generating plasma from the process gas, in which the plasma generation unit includes: an inner coil part including a plurality of inner coils; an outer coil part provided to surround the inner coil part when viewed from above and including a plurality of outer coils; an upper power source for applying power to the inner coil part and the outer coil part, each of the inner coils and each of the outer coils are provided to be concentric with each other, each of the inner coils and the outer coils has: a first portion provided in a shape of an arc having a first radius with respect to the concentric point; second portion provided in a shape of an arc having a second radius with respect to the concentric point; a third portion provided in a shape of an arc having a third radius with respect to the concentric point; a first connection portion for connecting the other end of the first portion and one end of the second portion; and a second connection portion for connecting the other end of the second portion and one end of the third portion, the first connection portion and the second connection portion are each provided to be inclined with respect to the straight line through the concentric point, any one of the first portion and the third portion has a power terminal to which an electricity line receiving power from the power source is connected, the other of the first portion and the third portion has a ground terminal to which a ground line is connected, and in each of the inner coils and the outer coils, the power terminal and the ground terminal are located on a straight line through the concentric point.

According to the exemplary embodiment, the ground terminal, the power terminal, and the concentric point may be sequentially disposed on the straight line, a power terminal of one of the inner coils, a power terminal of one of the outer coils, and the concentric point may be disposed on the straight line, the straight line through the concentric point may pass through only any one of the first portion to the third portion, and the inner coils and the outer coils may be all disposed in the same plane.

According to the exemplary embodiment, the apparatus may further include a ground plate disposed above the coil part, in which the ground terminal may be connected to the ground plate.

According to the exemplary embodiment, the chamber may include: a lower body; a cover combined with the lower body to form the processing space; an upper body combined with the cover to form an interior space in which the inner coil part and outer coil part are disposed; and a fan unit for supplying airflow to the interior space, and the ground plate is disposed in the interior space, and the ground plate is formed with openings to allow the airflow to circulate in the interior space, and the fan unit may include: a first fan; and a second fan for supplying the airflow to the interior space at a position different from the first fan, and the opening is formed in the ground plate at a position overlapping the first fan and/or the second fan when viewed from above.

Advantageous Effects

According to the exemplary embodiments of the present invention, it is possible to efficiently process a substrate.

According to the exemplary embodiment of the present invention, it is possible to improve processing uniformity for a substrate.

Furthermore, according to the exemplary embodiment of the present invention, it is possible to secure a greater range of plasma density control.

The effect of the present invention is not limited to the foregoing effects, and those skilled in the art may clearly understand non-mentioned effects from the present specification and the accompanying drawings.

BEST MODE

Figure 1:
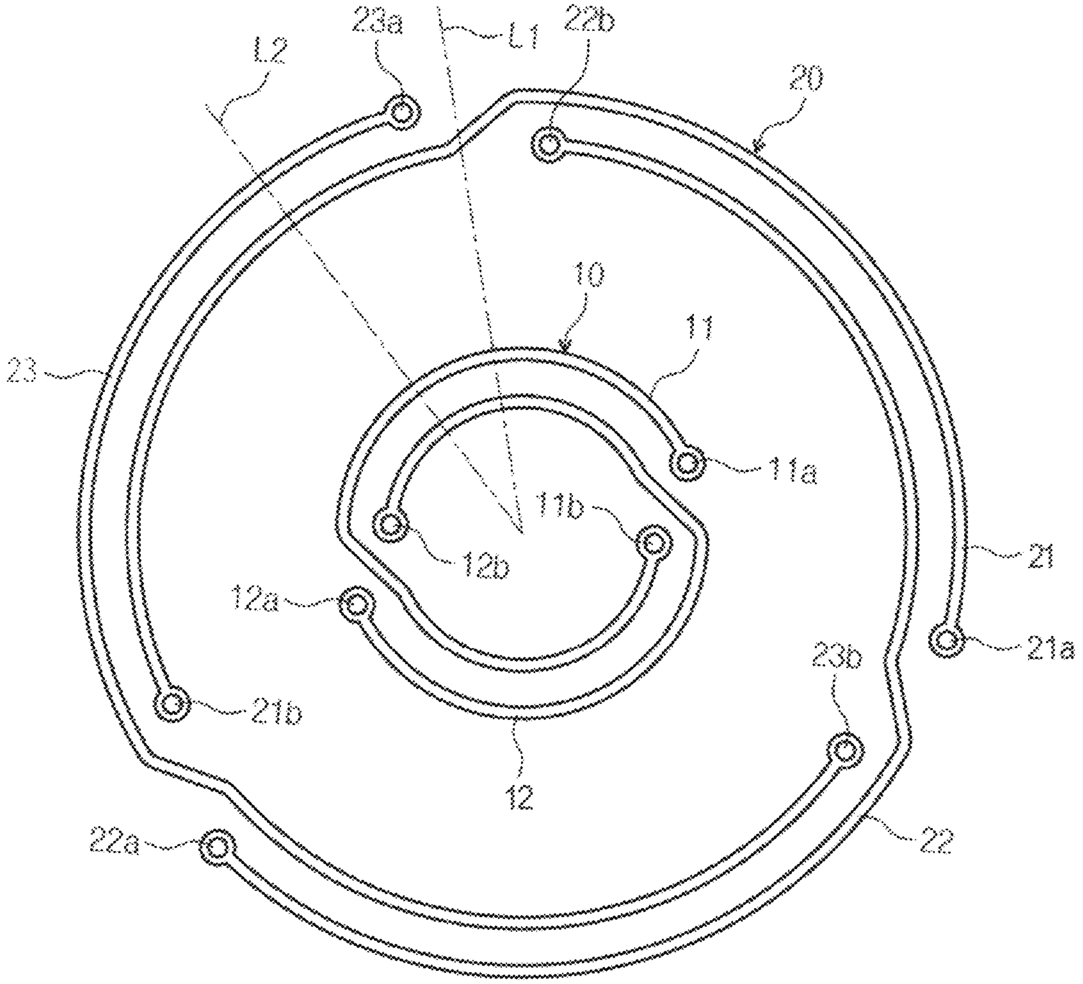
FIG. 1 is a diagram for illustrating coils of a typical plasma generation unit viewed from above.

Hereinafter, an exemplary embodiment of the present invention will be described more fully hereinafter with reference to the accompanying drawings, in which exemplary embodiments of the invention are illustrated. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "include" will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

Hereinafter, an exemplary embodiment of the present invention will be described in detail with reference to FIGS. 4 to 14.

Figure 4:
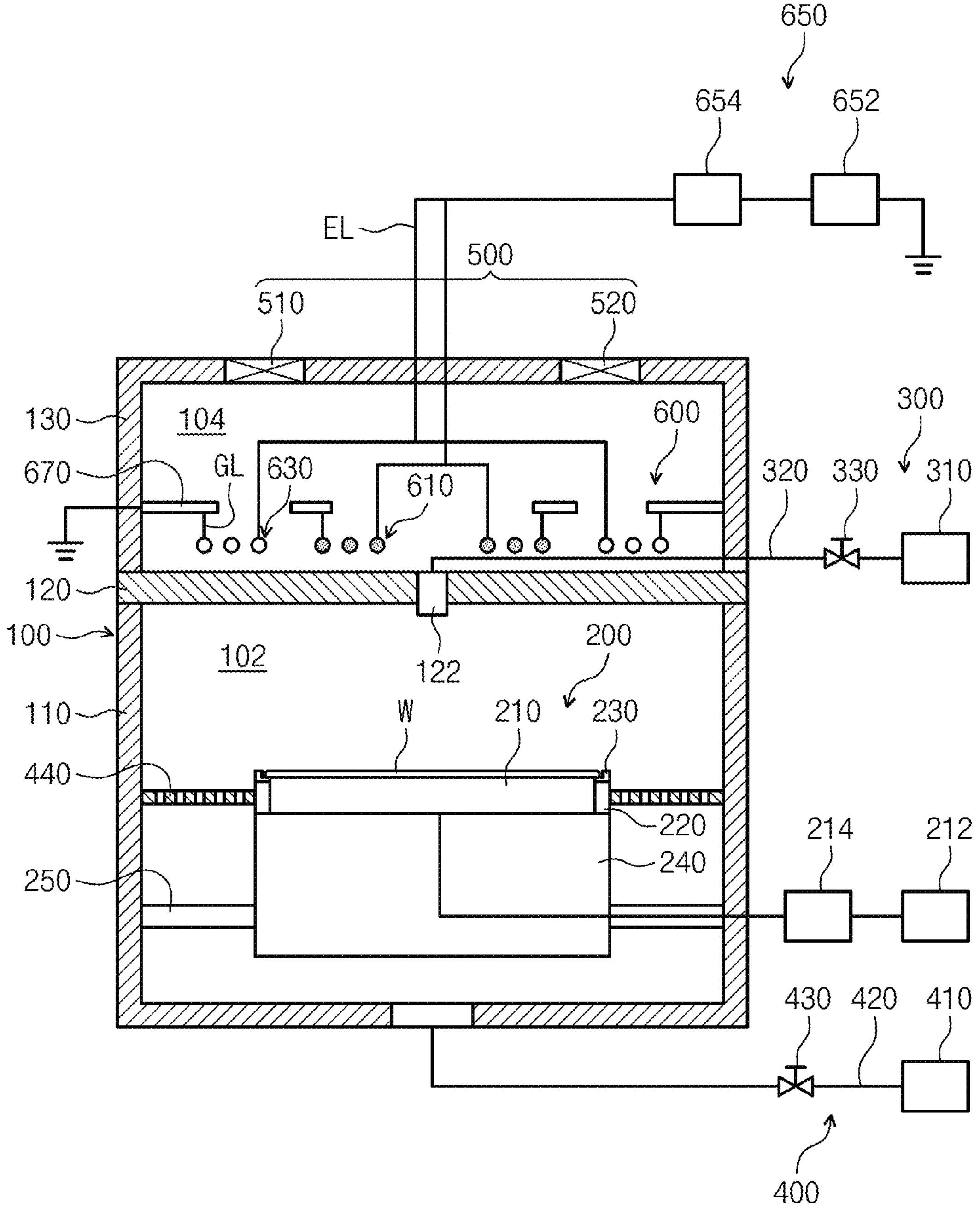
FIG. 4 is a diagram schematically illustrating a substrate processing apparatus according to an exemplary embodiment of the present invention.

FIG. 4 is a diagram schematically illustrating a substrate processing apparatus according to an exemplary embodiment of the present invention. Referring to FIG. 4, a substrate processing apparatus according to an exemplary embodiment of the present invention may include a chamber 100, a support unit 200, a gas supply unit 300, a gas exhaust unit 400, a fan unit 500, a plasma generation unit 600, and a controller (not shown).

The chamber 100 may have a processing space 102 and an interior space 104. For example, the chamber 100 may include a lower body 110, a cover 120, and an upper body 130. The lower body 110 may have a barrel shape with an open top. The cover 120 may be disposed on top of the lower body 110. The cover 120 may be combined with the lower body 110 each other to form the processing space 102. An upper body 130 may be disposed on top of the cover 120. The upper body 130 may have a barrel shape with an open bottom. The upper body 130 may be combined with the cover 120 each other to form an interior space 104. The interior space 104 may be disposed above the processing space 102. The processing space 102 may be used as a space where the support unit 200, described later, supports a substrate W and where the substrate W is processed. The interior space 104 may be used as a space where an inner coil part 610, an outer coil part 630, and a ground plate 670, which will be described below, are disposed. Additionally, the chamber 100 may be grounded. In addition, a gas supply pipe 122 connected with a gas supply line 122, which will be described below, may be provided in the center of the cover 120.

The support unit 200 may support the substrate W in the processing space 102. The support unit 200 may chuck the substrate W. The support unit 200 may include a chuck 210, an isolation ring 220, a focus ring 230, a chuck cover 240, and an interface cover 250.

The chuck 210 may have a seating surface that supports a bottom surface of the substrate W. The chuck 210 may be an ESC. The substrate W placed in the chuck 210 may be a wafer. Power may be applied to the chuck 210. For example, high frequency power applied by a lower power source 212 may be delivered to the chuck 210. Further, a first matcher 214 may be installed between the lower power source 212 and the chuck 210 to perform a match on the high frequency power applied by the lower power source 212.

The insulating ring 220 may be provided to surround the chuck 210 when viewed from above. On the top surface of the insulating ring 220, the focus ring 230 may be placed. The top surface of the focus ring 220 may be stepped such that an inner height is lower than an outer height. On the inner side of the focus ring 220, the lower surface of the edge region of the substrate W, which is placed on the chuck 210, may be placed. That is, the center region of the substrate W may be placed on a seating surface of the chuck 210, and the edge region of the substrate W may be placed on the inner top surface of the focus ring 220.

The chuck cover 240 may be disposed at a lower portion of the chuck 210. The chuck cover 240 may have a generally barrel shape with an open top. The chuck cover 240 may be disposed at a lower portion of the chuck 210 and form a lower space. The lower space may be provided with interface lines necessary to drive the support unit 200. These interface lines may be interconnected with apparatuses outside of the chamber 100 through the interface cover 250 having a space in communication with the lower space of the chuck cover 240.

The gas supply unit 500 may supply process gas to the processing space 102. The process gas supplied to the processing space 102 by the gas supply unit 300 may include at least one of $CF_4$, $N_2$, Ar, $H_2$, $O_2$, and O*. However, without limitation, the type of process gas supplied by the gas supply unit 300 to the processing space 102 may be varied with known process gases.

The gas supply unit 300 may include a gas supply source 310, a supply line 320, and a supply valve 330. The gas source 310 may deliver the process gas described above to the supply line 320, or may store the process gas. The supply line 320 may receive process gas from the gas supply source 310. One end of the supply line 320 may be connected to the gas supply pipe 122 described above, and the other end of the supply line 320 may be connected to the gas supply source 310. The supply valve 330 may be installed on the supply line 320. The supply valve 330 may be an open/close valve. However, without limitation, the supply valve 330 may be provided as a flow adjusting valve.

The gas exhaust unit 400 may exhaust process gas supplied to the processing space 102, and process by-products that may be generated during the process of processing the substrate W, from the processing space 102. The gas exhaust unit 400 may include a depressurization member 410, a depressurization line 420, a depressurization valve 430, and a vent plate 440.

The depressurization member 410 may provide depressurization to the processing space 102. The depressurization member 410 may be a pump. However, the depressurization member 410 is not limited thereto, and may be variously modified with any known apparatus capable of providing depressurization to the processing space 102. The depressurization provided by the depressurization member 410 may be delivered to the processing space 102 through the depressurization line 420 which fluid communicates with the processing space 102. Additionally, the depressurization valve 430 may be installed in the depressurization reducing line 420. The depressurization valve 430 may be an open/close valve. However, the depressurization valve 430 is not limited thereto, and may be provided as a flow adjusting valve. The vent plate 440 may have a ring shape when viewed from above. The vent plate 440 may be provided to surround the support unit 200 when viewed from above. A plurality of vent holes may be formed in the vent plate 440.

The fan unit 500 may provide airflow to the interior space 104. The fan unit 500 may provide temperature and humidity-controlled airflow to the interior space 104. The fan unit 500 may act as a cooler to prevent the temperature of the interior space 104 from becoming excessively high. The fan unit 500 may include a first fan 510 and a second fan 520. The first fan 510 and the second fan 520 may provide airflow to the interior space 104 from different locations. The first fan 510 and the second fan 520 may provide airflow to the interior space 104 in a downwardly directed direction.

The plasma generation unit 600 may generate plasma from process gas supplied to the processing space 102. The plasma generation unit 600 may include an inner coil part 610, an outer coil part 630, a power application unit 650, a ground plate 670, and an electricity line EL.

The inner coil part 610 and the outer coil par 630 may be disposed in the interior space 104. The inner coil part 610 and the outer coil part 630 may receive high frequency power from the power application part 650 which will be described later to generate plasma from process gas supplied to the processing space 102.

The inner coil part 610 may include a plurality of inner coils, and the outer coil part 630 may include a plurality of outer coils. The outer coil part 630 may be provided to surround the inner coil part 610 when viewed from above. Each of the inner coils and the outer coils may be provided concentric with each other. Each of the inner coils and the outer coils may have a first portion to an $n^{th}$ portion and a first connection portion and an $n-1^{th}$ connection portion. Herein, N is a natural number equal to or greater than 2. The first portion and the $n^{th}$ portion are each provided in the shape of an arc with different radii with respect to the concentric point. A $k+1^{th}$ portion has a radius larger than a $k^{th}$ portion. A $k^{th}$ connection portion connects the $k^{th}$ portion and the $k+1^{th}$ portion. Herein, k is a natural number equal to or greater than 1 and equal to or less than n−1. One of the first portion and the $n^{th}$ portion has a power terminal 611*a* to which the electricity line EL receiving electric power from a power source is connected, and the other of the first portion and the $n^{th}$ portion has a ground terminal 611*b* to which a ground line GL is connected. In each of the inner coils and the outer coils, the power terminal 611*a* and the ground terminal 611*b* are located on a straight line through the concentric point.

The present invention will be described based on the case where three inner coils and three outer coils are provided, and each inner coil and outer coil has a first portion and a third portion and a first connection portion and a second connection portion.

Figure 5:
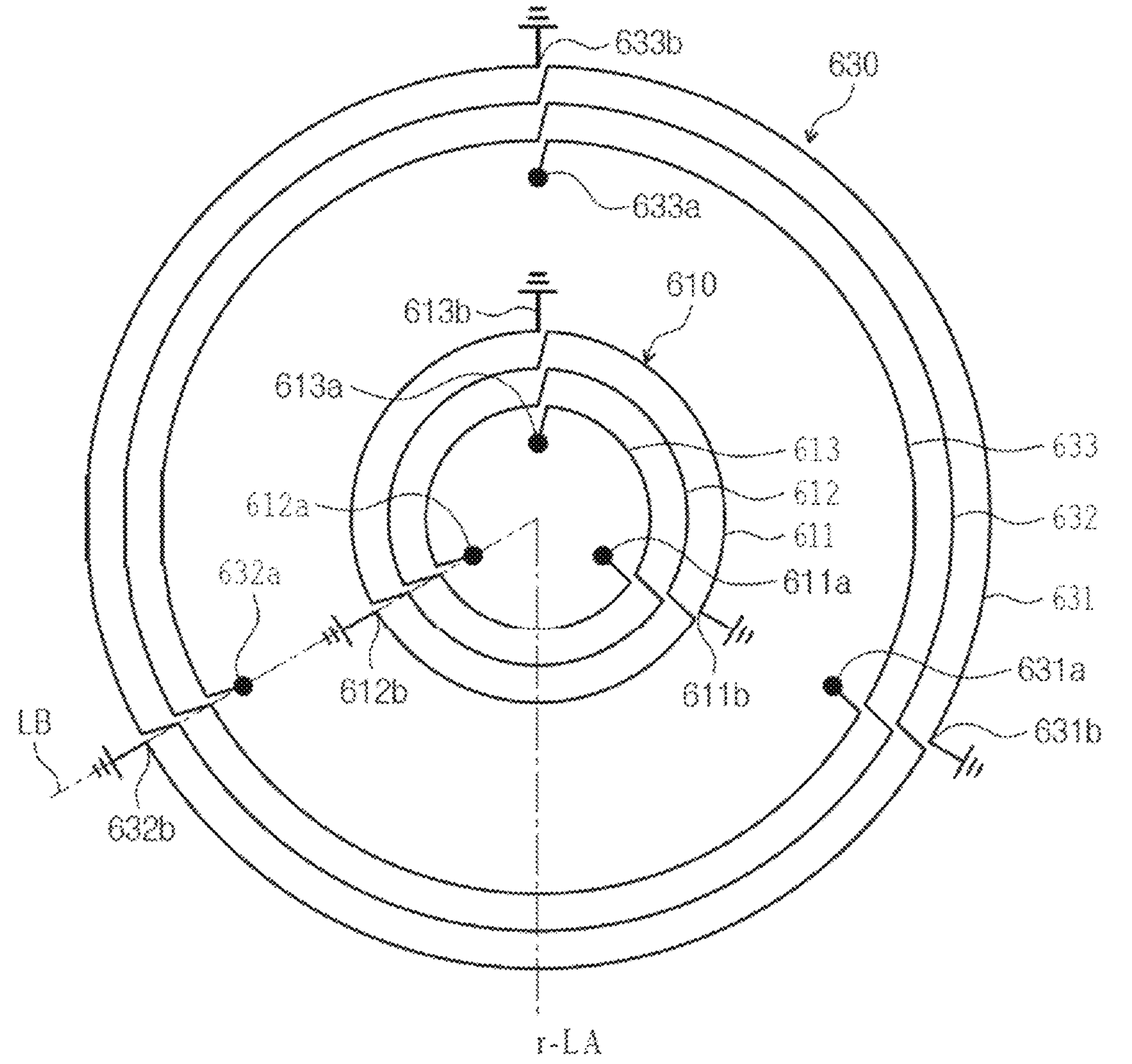
FIG. 5 is a diagram for illustrating an inner coil part and an outer coil part of FIG. 4.

FIG. 5 is a diagram for illustrating the inner coil part and the outer coil part of FIG. 4. Referring to FIG. 5, the inner coil part 610 may be disposed at a location corresponding to the center region of the processing space 102 as viewed from above. The outer coil part 630 may be disposed at a location corresponding to an edge region of the processing space 102 as viewed from above. The outer coil part 630 may be provided to surround the inner coil part 610 when viewed from above. The inner coil part 610 may include a first inner coil 611, a second inner coil 612, and a third inner coil 613. The outer coil part 630 may include a first outer coil 631, a second outer coil 632, and a third outer coil 633. In addition, the inner coil part 610 may include a ground line GL, which is described below. Further, the outer coil part 630 may include a ground line GL which will be described below.

Since the first inner coil 611, the second inner coil 612, and the third inner coil 613 have the same or similar shape as each other, the first inner coil 611 will be described in detail. The first inner coil 611 may have a ring shape. An electric power terminal 611*a* to which the electricity line EL which will be described below is connected may be formed at one end of the first inner coil 611, and a ground terminal 611*b* to which the ground line GL which will be described below is connected may be formed at the other end of the first inner coil 611. When viewed from above, the power terminal 611*a* may be provided in a region closer to the center of the processing space 102 than the ground terminal 611*b*. Further, the power terminal 611*a* and the ground terminal 611*b* may be disposed on a virtual straight line drawn from the center of the substrate W supported on the support unit 200 (that is, from the center of the chamber 102) in a radial direction of the substrate W (that is, in a direction toward an edge region of the chamber 102). That is, the power terminal 611*a* and the ground terminal 611*b* may be disposed on a straight line. Similarly, a power terminal 612*a* may be formed at one end of the second inner coil 612 and a ground terminal 612*b* may be formed at the other end of the second inner coil 612, and the power terminal 612*a* and the ground terminal 612*b* may be disposed on a virtual straight line LB drawn from the center of the chamber 102 in the direction toward the edge region of the chamber 102. Similarly, a power terminal 613*a* may be formed at one end of the third inner coil 613 and a ground terminal 613*b* may be formed at the other end of the third inner coil 613, and the power terminal 613*a* and the ground terminal 613*b* may be disposed on a virtual straight line drawn from the center of the chamber 102 in the direction toward the edge region of the chamber 102. That is, the second inner coil 612 and the third inner coil 613 may have a similar shape to the first inner coil 611, and the inner coil part 610 may include three turns overall when viewed from above. However, the inner coil part 610 is not limited thereto, and may have more than three turns overall.

Further, when viewed from above, the number of times that the virtual straight lines LA drawn in the radial direction of the substrate W supported on the support unit 200 from the center of the substrate W supported on the support unit 200 overlap with the inner coils 611, 612, and 613 may be three all the same except for the points where the power terminals 611*a*, 612*a*, and 613*a* and the ground terminals 611*b*, 612*b*, and 613*b* are formed. Further, the gap between the first inner coil 611 and the second inner coil 612 may be 10 mm or more. Further, a gap between the second inner coil 612 and the third inner coil 613 may be 10 mm or more. Further, the diameters of the first inner coil 611, the second inner coil 612, and the third inner coil 613 as viewed in cross-section may be 5 to 50 mm.

Since the first outer coil 631, second outer coil 632, and third outer coil 633 have the same or similar shape as each other, the first outer coil 631 will be described in detail. The first outer coil 631 may have a ring shape. A power terminal 631*a* to which the electricity line EL which will be described below is connected may be formed at one end of the first outer coil 631, and a ground terminal 631*b* to which the ground line GL which will be described below is connected may be formed at the other end of the first outer coil 631. When viewed from above, the power terminal 631*a* may be provided in a region adjacent to the center of the processing space 102 than the ground terminal 631*b*. Further, the power terminal 631*a* and the ground terminal 631*b* may be disposed on a virtual straight line drawn in a radial direction of the substrate W (that is, in the direction toward the edge region of the chamber 102) from the center of the substrate W (that is, from the center of the chamber 102) supported on the support unit 200. That is, the power terminal 611*a* and the ground terminal 611*b* may be disposed on a straight line.

Similarly, a power terminal 632*a* is formed at one end of the second outer coil 632, and a ground terminal 632*b* is formed at the other end of the second outer coil 532, and the power terminal 631*a* and the ground terminal 632*b* may be disposed on the virtual straight line LB drawn from the center of the chamber 102 in the direction toward the edge region of the chamber 102. Similarly, a power terminal 633*a* is formed at one end of the third outer coil 613, and a ground terminal 633*b* is formed at the other end of the third outer coil 613, and the power terminal 633*a* and the ground terminal 633*b* may be disposed on a virtual straight line drawn from the center of the chamber 102 in the direction toward the edge region of the chamber 102. That is, the second outer coil 632, and the third outer coil 633 have a similar shape to the first outer coil 631, and when viewed from above, the outer coil part 610 may include three turns overall. However, the outer coil part 630 is not limited thereto, and may include three or more turns overall.

Further, when viewed from above, the number of times that the virtual straight lines LA drawn in the radial direction of the substrate W supported on the support unit 200 from the center of the substrate W supported on the support unit 200 overlap with the outer coils 631, 632, and 633 may be three all the same except for the points where the power terminals 631*a*, 632*a*, and 633*a* and the ground terminals 631*b*, 632*b*, and 633*b* are formed. Further, the gap between the first outer coil 631 and the second outer coil 632 may be 10 mm or more. Additionally, the gap between the second outer coil 632 and the third outer coil 633 may be 10 mm or more. The first outer coil 631, second outer coil 632, and third outer coil 633 may have a diameter of 5 to 50 mm as viewed in cross-section.

Further, the power terminal 611*a* and the ground terminal 611*b* of the first inner coil 611 and the power terminal 631*a* and the ground terminal 631*b* of the first outer coil 631 may be disposed on the virtual straight line drawn in the radial direction of the substrate W supported on the support unit 200 from the center of the substrate W supported on the support unit 200, which is the object to be processed matter, when viewed from above. Similarly, the power terminal 612*a* and the ground terminal 612*b* of the second inner coil 612, and the power terminal 632*a* and the ground terminal 632*b* of the second outer coil 632 may be disposed on the virtual straight line LB drawn in the radial direction of the substrate W supported on the support unit 200 from the center of the substrate W supported on the support unit 200, which is the object to be processed, when viewed from above. Similarly, the power terminal 613*a* and the ground terminal 613*b* of the third inner coil 613, and the power terminal 633*a* and the ground terminal 633*b* of the third outer coil 633 may be disposed on the virtual straight line drawn in the radial direction of the substrate W supported on the support unit 200 from the center of the substrate W supported on the support unit 200, which is the object to be processed, when viewed from above. Further, the power terminals 611*a*, 612*a*, and 613*a* of the inner coil part 610 may be equally spaced from each other along a circumferential direction with respect to the center of the processing space 102 when viewed from above. Further, the power terminals 631*a*, 632*a*, and 633*a* of the outer coil part 630 may be equally spaced from each other along the circumferential direction with respect to the center of the processing space 102 when viewed from above.

The coils of the inner coil part 610 and the coils of the outer coil part 630 described above may be provided from a metallic material including at least one of copper, aluminum, tungsten, silver, gold, platinum, and iron. In addition, the surfaces of the coils of the inner coil part 610 and the coils in the outer coil part 630 may be coated with a metallic material including at least one of silver, gold, and platinum. The coating layer may be a metal having a low resistivity and good thermal conductivity. The coating layer may have a thickness of 20 micrometers or more. The coating layer may also be formed by physical vapor deposition (sputtering, evaporating) or chemical vapor deposition (CVD), spraying, electroplating, and the like.

Referring again to FIG. 4, the power application unit 650 may apply high frequency power to the inner coil part 610 and the outer coil part 630. The power application portion 650 may include an upper power source 652, and a second matcher 654. The upper power source 652 may be a high frequency power source. The second matcher 654 may perform matching of the high frequency power applied by the upper power source 652 to the inner coil part 610 and the outer coil part 630. In addition, one end of the power line EL carrying the high frequency power generated by the upper power source 652 may be connected to the previously described power terminals 611*a*, 612*a*, 613*a*, 631*a*, 632*a*, and 633*a*.

Additionally, the interior space 104 may be provided with the ground plate 670. The ground plate 670 may be provided from a metallic material including at least one of aluminum, copper, and iron. The ground plate 670 may have a thickness of 3 mm or more. The ground plate 670 may be spaced apart from the inner coil part 610 and the outer coil part 630 by 50 millimeters or more. The ground plate 670 may be grounded. The ground plate 670 may ground the inner coil part 610 and the outer coil part 630. The ground plate 670 may be disposed above the inner coil part 610 and outer coil part 630. Further, the ground plate 670 may have openings formed to allow airflow supplied to the interior space 104 by the fan unit 500 described above to circulate freely in the interior space 104. For example, a circular-shaped opening may be formed in a center region of the ground plate 670 when viewed from above. Additionally, a plurality of arc-shaped openings may be formed in a middle region surrounding the center region of the ground plate 670 when viewed from above. The arc-shaped openings formed in the middle region of the ground plate 670 may be formed in the ground plate 670 in a position that overlaps with the first fan 510 or the second fan 520 when viewed from above.

The ground line GL may electrically connect the ground plate 670 and the coils 611, 612, and 613 of the inner coil part 610 to each other. The ground lines GL may electrically connect the ground plate 670 and the coils 631, 632, and 633 of the outer coil part 630 to each other. The ground lines GL may be provided in plurality. The ground lines GL may be provided in a plurality, and one end of each of the ground lines GL may be connected to the ground plate 670 and the other end of each of the ground lines GL may be connected to the ground terminals 611*b*, 612*b*, 613*b*, 631*b*, 632*b*, and 633*b* described above. The ground lines GL may be equally spaced along a circumferential direction with respect to the center of the ground plate 670 when viewed from above. That is, the disposition of the ground lines GL is symmetrical.

The controller (not shown) may control configurations of the substrate processing apparatus. For example, the controller may control the support unit 200, the gas supply unit 300, the gas exhaust unit 400, the fan unit 500, and the plasma generation unit 600. Further, the controller may include a process controller formed of a microprocessor (computer) that executes the control of the substrate processing apparatus, a user interface formed of a keyboard in which an operator performs a command input operation or the like in order to manage the substrate processing apparatus, a display for visualizing and displaying an operation situation of the substrate processing apparatus, and the like, and a storage unit storing a control program for executing the process executed in the substrate processing apparatus under the control of the process controller or a program, that is, a treatment recipe, for executing the process in each component according to various data and processing conditions. Further, the user interface and the storage unit may be connected to the process controller. The treating recipe may be stored in a storage medium in the storage unit, and the storage medium may be a hard disk, and may also be a portable disk, such as a CD-ROM or a DVD, or a semiconductor memory, such as a flash memory.

Figure 6:
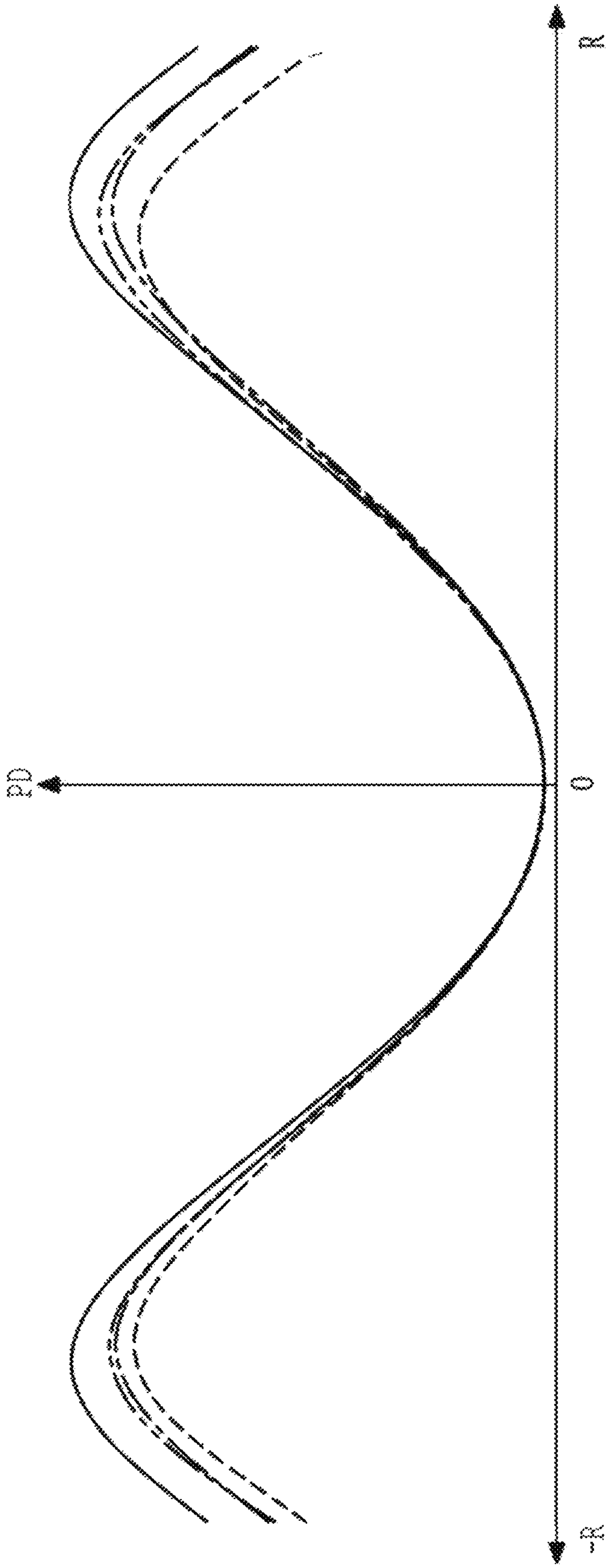
FIG. 6 is a graph of plasma density generated by the outer coil part of FIG. 4 according to distance from the center of a processing space.
Figure 7:
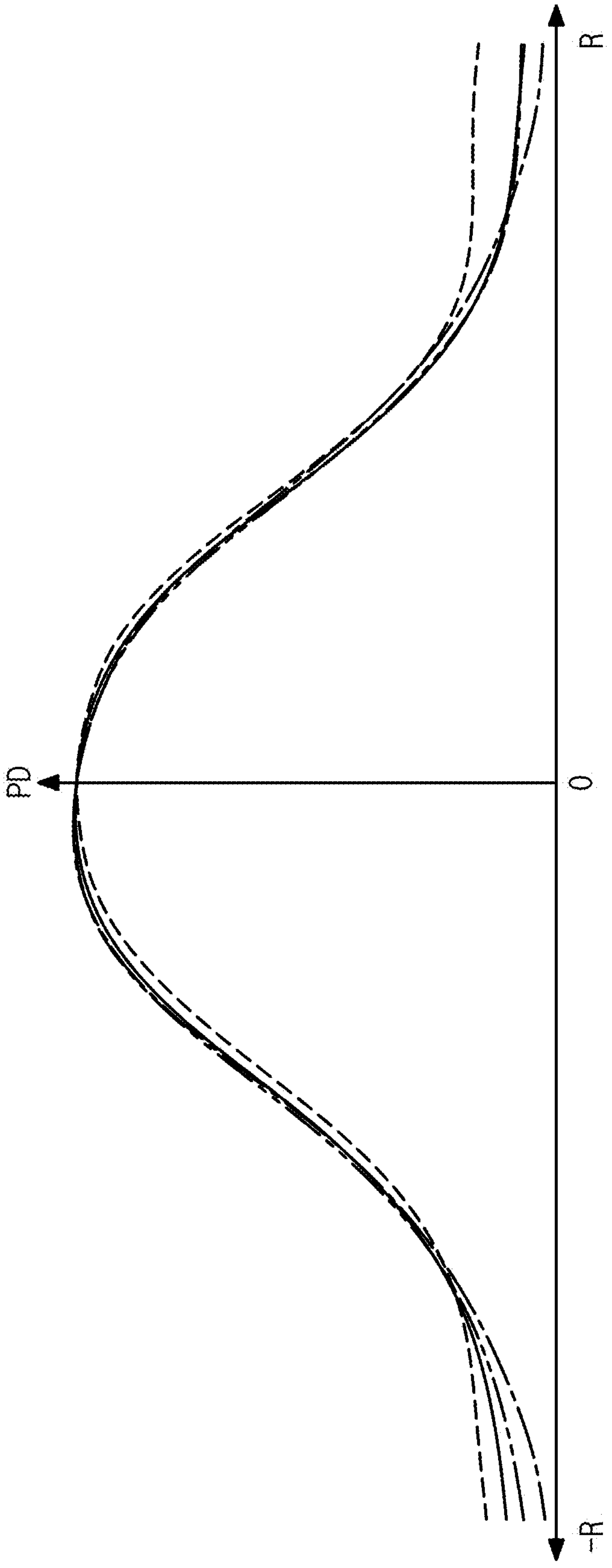
FIG. 7 is a graph of plasma density generated by the inner coil part of FIG. 4 according to distance from the center of a processing space.

FIG. 6 is a graph of plasma density generated by the outer coil part of FIG. 4 according to a distance from the center of the processing space, and FIG. 7 is a graph of plasma density generated by the inner coil part of FIG. 4 according to a distance from the center of the processing space. FIGS. 6 and 7 illustrate the variation of plasma density PD according to a distance from the center of the processing space 102 of the chamber 100 (for example, the center of substrate W, which is the object to be processed, placed in the processing space 102). Further, FIGS. 6 and 7 illustrate plasma density PD along a first direction, plasma density PD along a second direction perpendicular to the first direction, and plasma density PD along a third direction and a fourth direction, respectively, which are angled 45 degrees with respect to the first direction and the second direction, when viewed from above.

Figure 2:
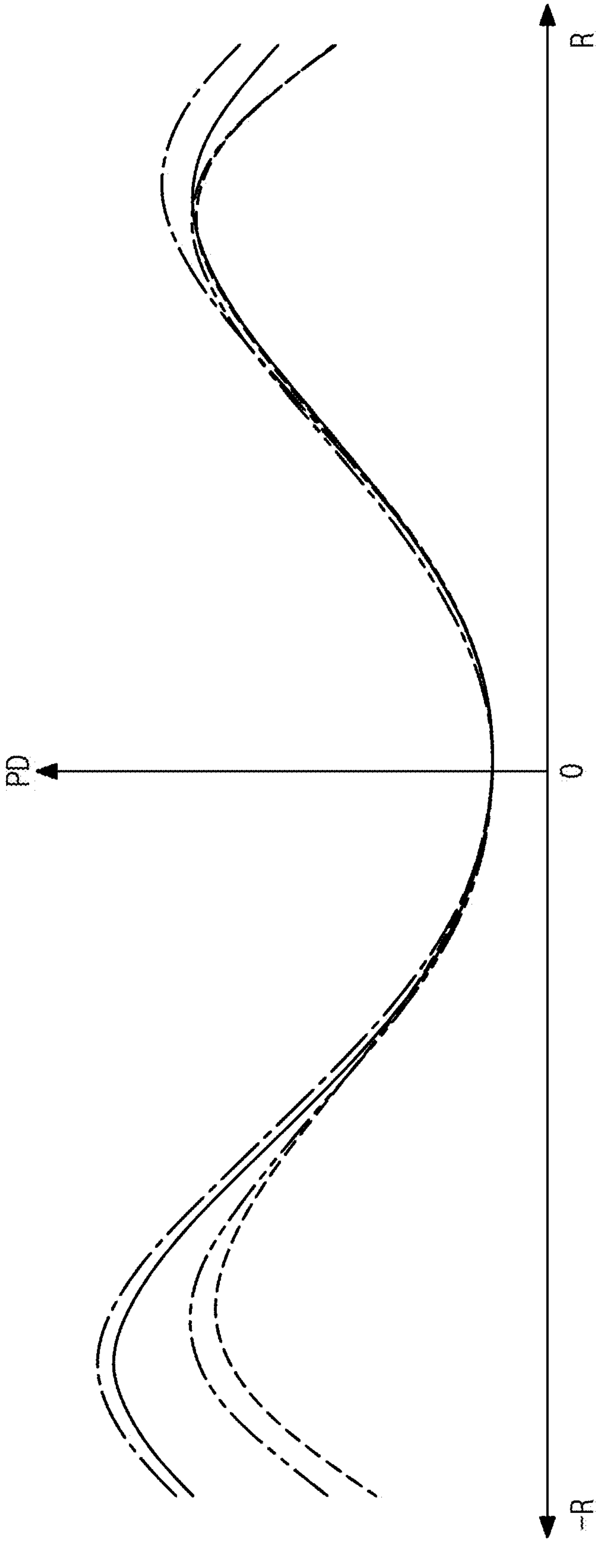
FIG. 2 is a graph of plasma density generated by outer coils of FIG. 1 according to a distance from the center of a space of a chamber.
Figure 3:
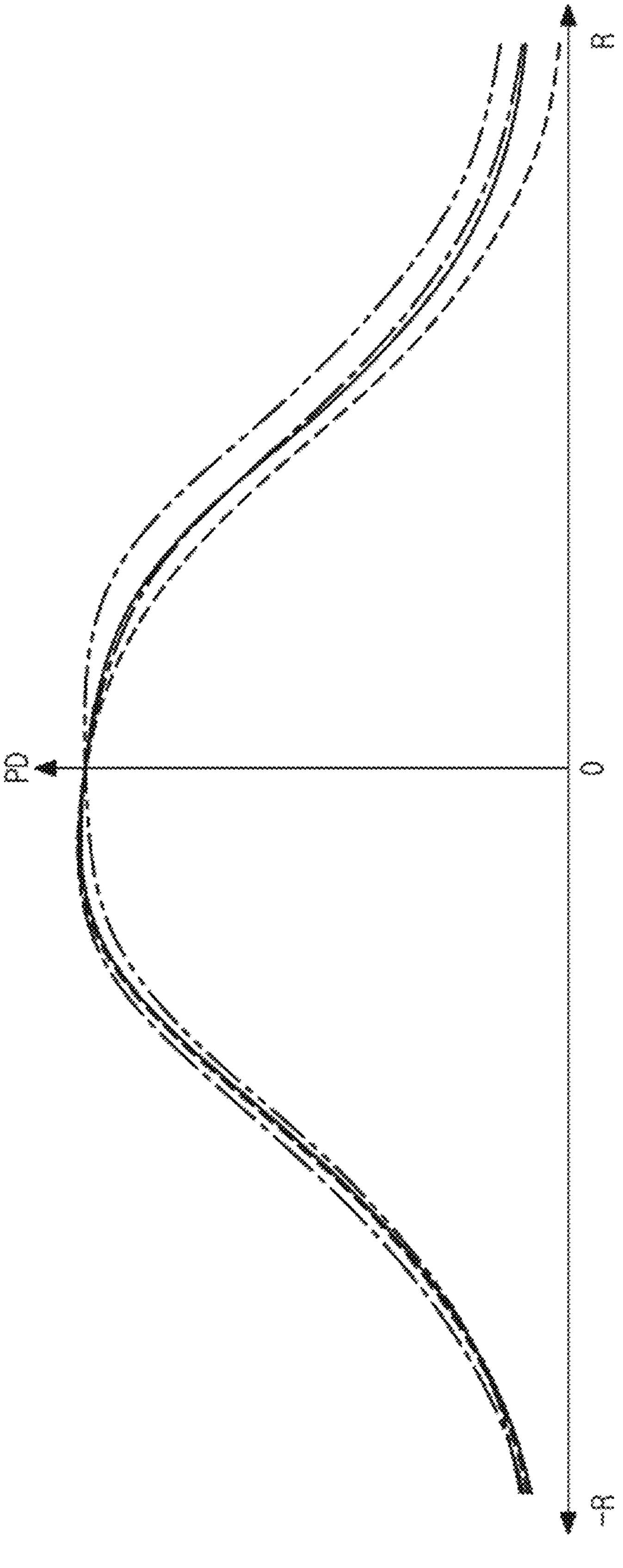
FIG. 3 is a graph of plasma density generated by inner coils of FIG. 2 according to a distance from the center of a space in the chamber.

As can be seen by comparing foregoing FIG. 2 and FIG. 6 to each other, the uniformity of the plasma density PD that the outer coil part 630 forms in the processing space 102 is greatly improved. As can be seen by comparing foregoing FIG. 3 and FIG. 7 to each other, the uniformity of the plasma density PD that the inner coil part 610 forms in the processing space 102 is greatly improved. This is because, when viewed from above as described above, all of the virtual lines LA and LB drawn from the center of the processing space 102 overlap the internal coils 611, 612, and 613 by the same number, except at the points where the power terminals and the ground terminals are formed. Similarly, this is because, when viewed from above as described above, all of the virtual lines LA and LB drawn from the center of the processing space 102 overlap the outer coils 631, 632, and 633 by the same number, except at the points where the power terminals and the ground terminals are formed. Furthermore, as described above, the power terminals and the ground terminals are disposed in a straight line when viewed from above. In other words, because the plasma generation unit 600 according to the exemplary embodiment of the present invention has a highly symmetrical structure, the uniformity (side-to-side symmetry) of the plasma density PD generated in the processing space 102 is greatly improved, and the effect of the improvement to the plasma density PD may be more pronounced when the coils are configured with three or more turns.

Figure 8:
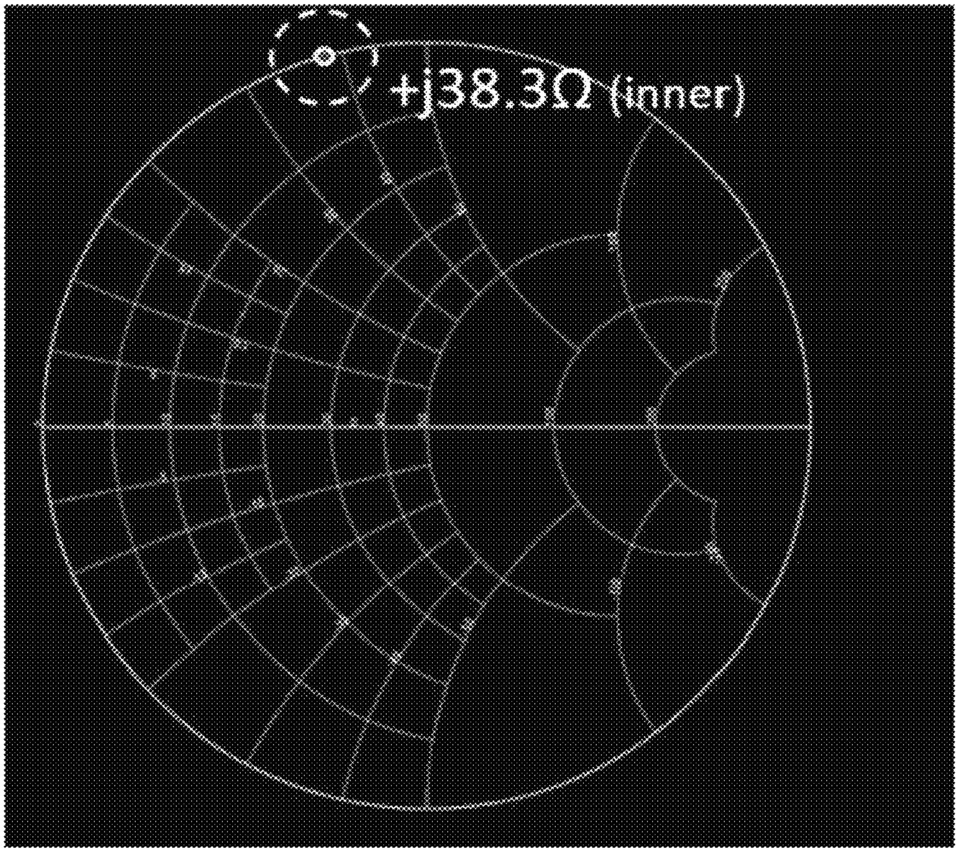
FIG. 8 is a diagram for illustrating the result of measuring impedance of the inner coil part when a ground plate of FIG. 4 is not installed.
Figure 9:
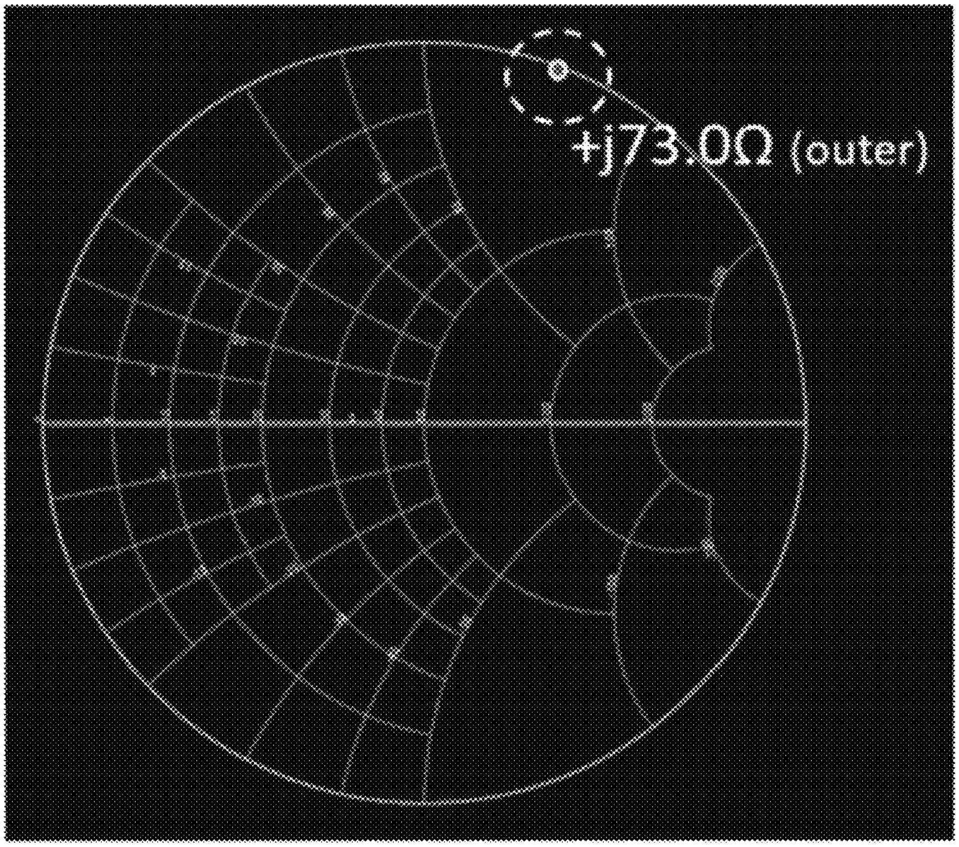
FIG. 9 is a diagram for illustrating the result of measuring impedance of the outer coil part when a ground plate of FIG. 4 is not installed.

FIG. 8 is a diagram for illustrating the result of measuring impedance of the inner coil part when the ground plate of FIG. 4 is not installed, and FIG. 9 is a diagram for illustrating the result of measuring impedance of the outer coil part when the ground plate of FIG. 4 is not installed. Further, FIG. 10 is a diagram for illustrating the result of measuring impedance of the inner coil part when the ground plate of FIG. 4 is installed, and FIG. 11 is a diagram for illustrating the result of measuring impedance of the outer coil part when the ground plate of FIG. 4 is installed.

Figure 10:
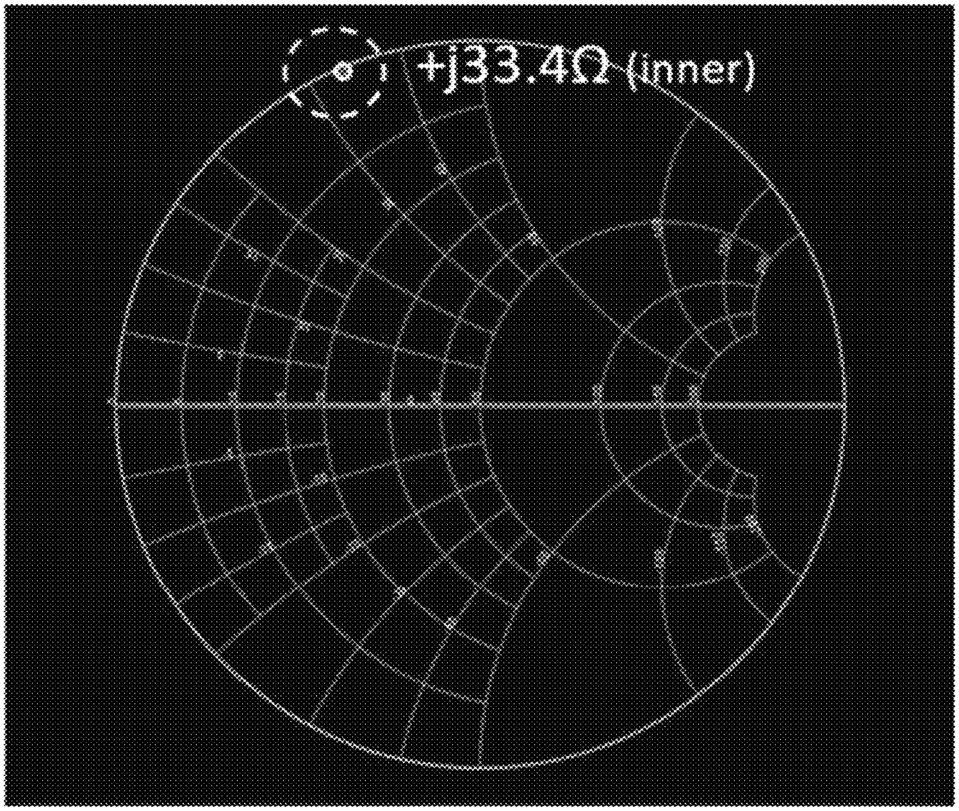
FIG. 10 is a diagram for illustrating the result of measuring impedance of the inner coil part when a ground plate of FIG. 4 is installed.
Figure 11:
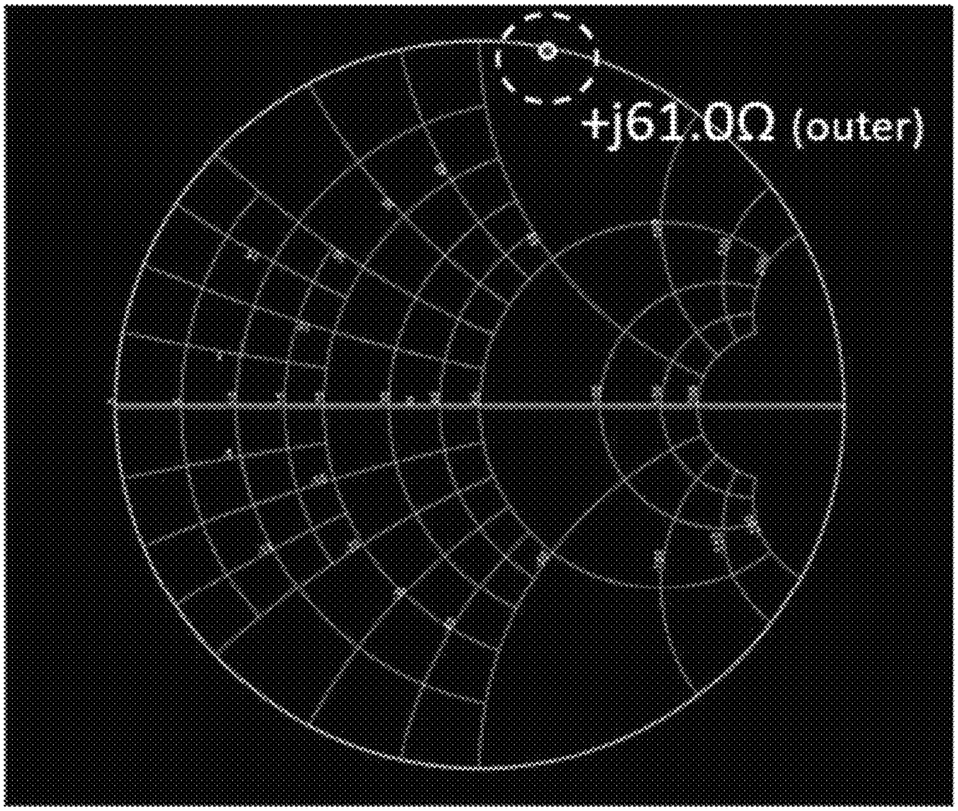
FIG. 11 is a diagram for illustrating the result of measuring impedance of the outer coil part when a ground plate of FIG. 4 is installed.

As can be seen by comparing FIGS. 8 and 10 to each other, and FIGS. 9 and 11 to each other, the impedance of the inner coil part 610 and outer coil part 630 is reduced when the ground plate 670 is installed. This is because as the ground plate 670 is disposed, the length of the ground line GL is shortened. In particular, it can be seen that the level of the decrease in impedance is more pronounced for the outer coil part 630. This reduction in the impedance of the inner coil part 610 and the outer coil part 630 enables the use of a larger section of matching area within the matching system implemented by the second matcher 654.

Figure 12:
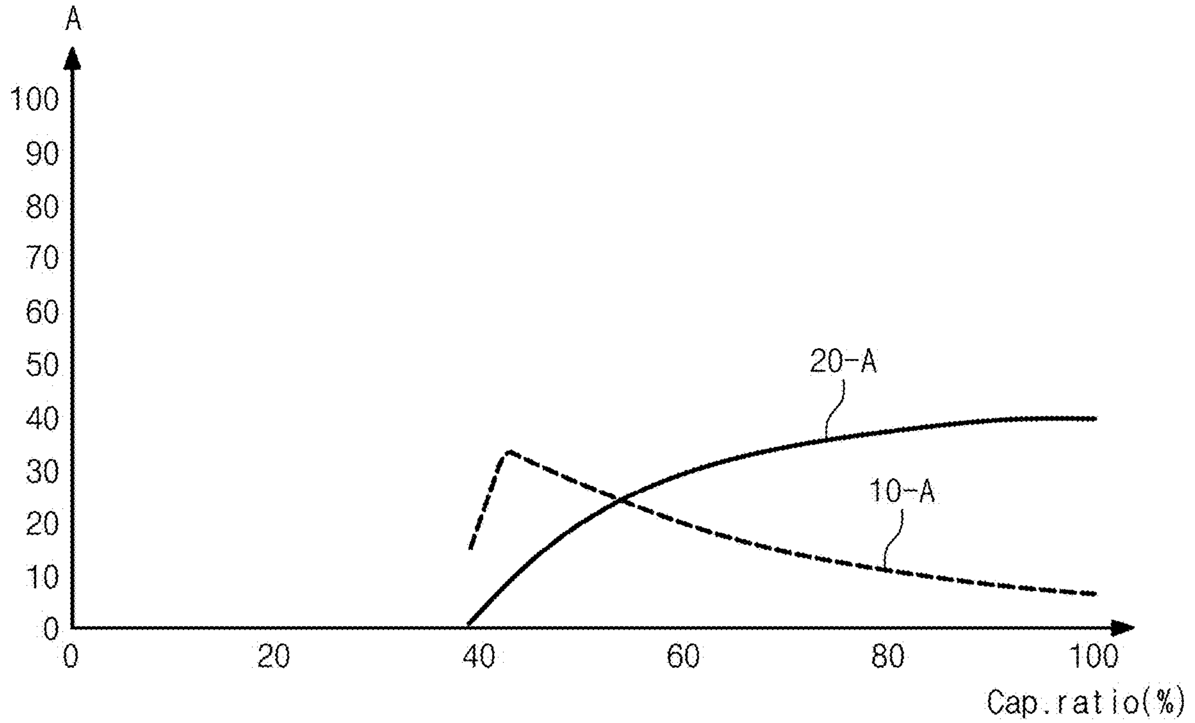
FIG. 12 is a graph showing current measurement results of the inner coil and the outer coil of FIG. 1.
Figure 13:
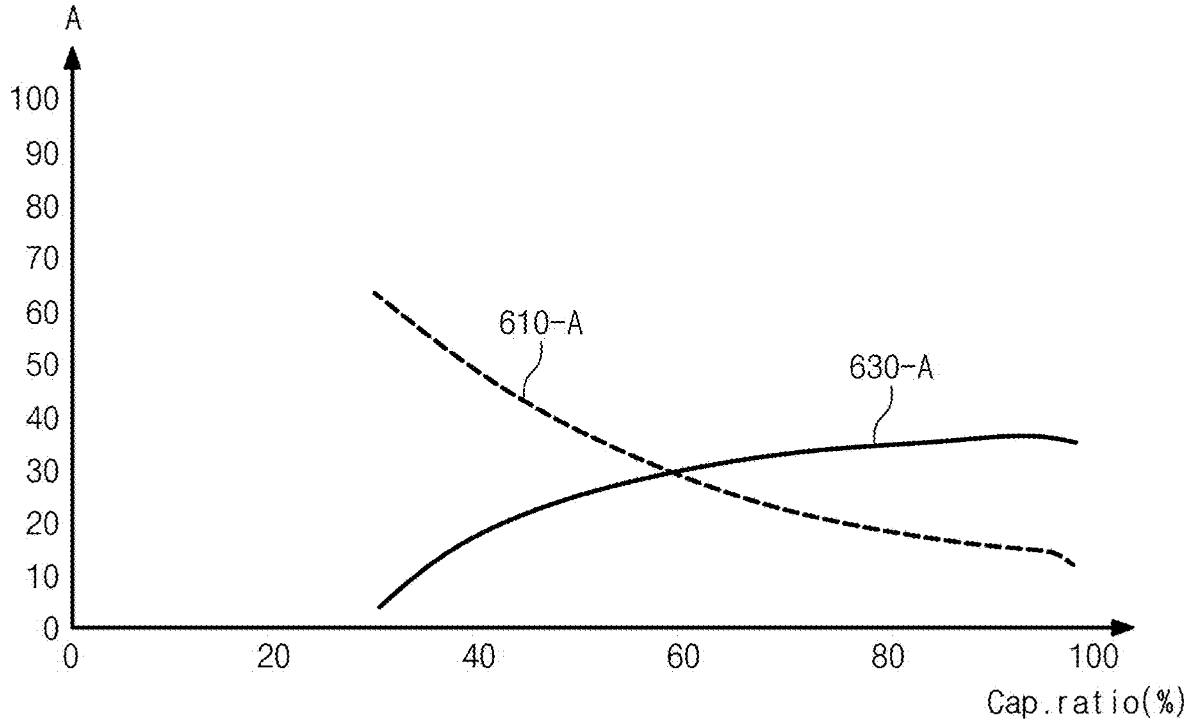
FIG. 13 is a graph showing current measurement results of the inner coil part and the outer coil part when the ground plate of FIG. 4 is not installed.
Figure 14:
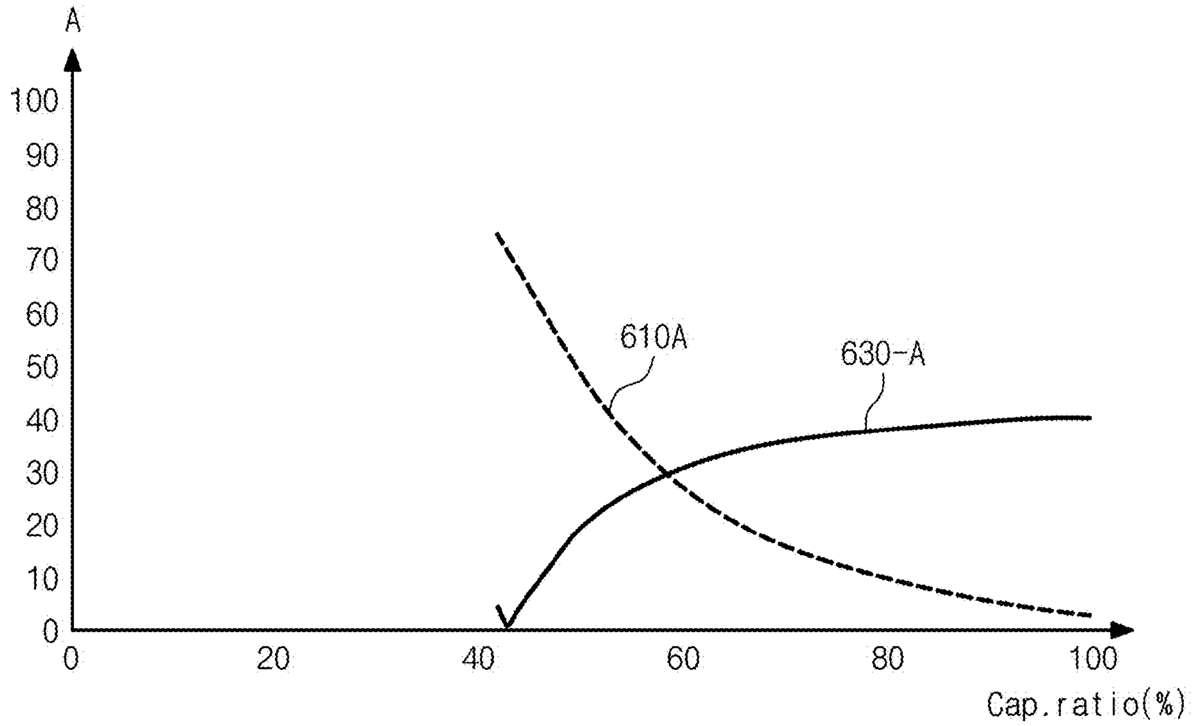
FIG. 14 is a graph showing current measurement results of the inner coil part and the outer coil part when the ground plate of FIG. 4 is installed.

FIG. 12 is a graph showing current measurement results of the inner coil module 10 and the outer coil module 20 of FIG. 1, FIG. 13 is a graph showing current measurement results of the inner coil part 610 and the outer coil part 630 when the ground plate 670 of FIG. 4 is not installed, and FIG. 14 is a graph showing current measurement results of the inner coil part 610 and the outer coil part 630 when the ground plate 670 of FIG. 4 is installed. FIG. 12 illustrates current measurement data 10-A of the inner coil module 10 and current measurement data 20-A of the outer coil module 20. FIGS. 13 to 14 illustrate current measurement data 610-A of the inner coil part 610 and current measurement data 630-A of the outer coil part 630. FIGS. 12 to 14 show the results of measuring the current flowing in the inner coil part 610 and the outer coil part 630 by adjusting a capacitor in the matching system implemented by the second matcher 654.

As can be seen in FIG. 12, the ratio of the current flowing in the inner coil module 10 to the current flowing in the outer coil module 20 is adjustable from 3:1 to 1:4. As can be seen in FIG. 13, the ratio of the current flowing in the inner coil part 610 to the current flowing in the outer coil part 630 is adjustable from 15:1 to 1:3. As can be seen in FIG. 14, the ratio of the current flowing in the inner coil part 610 to the current flowing in the outer coil part 630 is adjustable from 20:1 to 1:20. In other words, when the configuration of the coils of the inner coil part 610 and the outer coil part 630 is three turns or more and the ground plate 670 is installed, as in one exemplary embodiment of the present invention, the ratio of the current flowing in the inner coil part 610 to the current flowing in the outer coil part 630 may be operated over a wider range, thereby more facilitating the control of plasma density PD.

In the above examples, the plasma generation unit was described as having an inner coil part and an outer coil part. In contrast, however, the plasma generation unit may include only one coil part.

The foregoing detailed description illustrates the present invention. Further, the above content illustrates and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the invention, and/or the scope of the skill or knowledge in the art. The foregoing exemplary embodiment describes the best state for implementing the technical spirit of the present invention, and various changes required in the specific application field and use of the present invention are possible. Accordingly, the detailed description of the invention abov'e is not intended to limit the invention to the disclosed exemplary embodiment. Further, the accompanying claims should be construed to include other exemplary embodiments as well.

The invention claimed is:

1. An apparatus for processing a substrate, the apparatus comprising:

a chamber having a processing space;

a support unit for supporting a substrate in the processing space;

a gas supply unit for supplying process gas to the processing space; and a plasma generation unit for generating plasma from the process gas, wherein the plasma generation unit includes:

an inner coil part including a plurality of inner coils;

an outer coil part provided to surround the inner coil part when viewed from above and including a plurality of outer coils;

an upper power source for applying power to the inner coil part and the outer coil part, and each of the inner coils and each of the outer coils are provided to be concentric with each other, each of the inner coils and the outer coils has:

a first portion to an $n^{th}$ portion, and a first connection portion to an $n-1^{th}$ connection portion, and Nis a natural number equal to or greater than 2, the first portion to the $n^{th}$ portion are each provided in a shape of an arc having a different radius with respect to the concentric point, the k+1$^{th}$ portion has a radius greater than the k$^{th}$ portion, the k$^{th}$ connection portion connects the k$^{th}$ portion to the k+1$^{th}$ portion, and the k is a natural number equal to or greater than 1 and equal to or less than n−1, any one of the first portion and the n$^{th}$ portion has a power terminal to which an electricity line receiving power from the power source is connected, the other of the first portion and the n$^{th}$ portion has a ground terminal connected with a ground line, and in each of the inner coils and the outer coils, the power terminal and the ground terminal are located on a straight line through the concentric point.

2. The apparatus of claim 1, wherein the ground terminal, the power terminal, and the concentric point are sequentially disposed on the straight line.

3. The apparatus of claim 2, wherein a power terminal connected to one inner coil among the inner coils, a power terminal connected to one outer coil among the outer coils, and the concentric point are disposed on the same line.

4. The apparatus of claim 1, wherein in any one inner coil among the inner coils or any one outer coil among the outer coils, the straight line through the concentric point passes through only any one of the first portion and the n$^{th}$ portion.

5. The apparatus of claim 1, wherein each of the first connection portion and the N−1$^{th}$ connection portion is provided to be inclined with respect to the straight line through the concentric point.

6. The apparatus of claim 1, wherein the n is 3.

7. The apparatus of claim 1, wherein the inner coils and the outer coils are each provided in the number of three.

8. The apparatus of claim 1, wherein the inner coils and the outer coils are all disposed in the same plane.

9. The apparatus of claim 8, wherein each of the inner coils and the outer coils has a center angle of 360 degrees, and the first portion to the n$^{th}$ portion are each provided with the same center angle.

10. The apparatus of claim 1, further comprising:

a ground plate disposed above the coil part, wherein the ground terminal is connected to the ground plate.

11. The apparatus of claim 10, wherein the chamber includes:

a lower body;

a cover combined with the lower body to form the processing space;

an upper body combined with the cover to form an interior space in which the inner coil part and outer coil part are disposed; and a fan unit for supplying airflow to the interior space, and the ground plate is disposed in the interior space, and the ground plate is provided with an opening to allow the airflow to circulate in the interior space.

12. The apparatus of claim 11, wherein the fan unit includes:

a first fan; and a second fan for supplying the airflow to the interior space at a position different from the first fan, and the opening is formed in the ground plate at a position overlapping the first fan and/or the second fan when viewed from above.

13. The apparatus of claim 1, wherein the inner coil and the outer coil are provided from a material including at least one of copper, aluminum, tungsten, silver, gold, platinum, and iron.

14. The apparatus of claim 1, wherein surfaces of the inner coil and the outer coil are coated with a material including at least one of silver, gold, and platinum.

15. The apparatus of claim 10, wherein the ground plate is provided from a material including at least one of aluminum, copper, and iron.

16. An apparatus for processing a substrate, the apparatus comprising:

a chamber having a processing space;

a support unit for supporting a substrate in the processing space;

a gas supply unit for supplying process gas to the processing space; and a plasma generation unit for generating plasma from the process gas, wherein the plasma generation unit includes:

a coil part including a plurality of coils; and an upper power source for applying power to the coil part, each of the coils has a first portion to an n$^{th}$ portion and a first connection portion to an n−1$^{th}$ connection portion, and N is a natural number equal to or greater than 2, the first portion to the n$^{th}$ portion are provided in a form of arcs that are concentric with each other, among the first portion to the n$^{th}$ portion, the k+1$^{th}$ portion has a radius greater than the k$^{th}$ portion, the k$^{th}$ connection portion connects the k$^{th}$ portion to the k+1$^{th}$ portion, and the k is a natural number equal to or greater than 1 and equal to or less than n−1, any one of the first portion and the n$^{th}$ portion has a power terminal to which an electricity line receiving power from the power source is connected, the other of the first portion and the n$^{th}$ portion has a ground terminal connected with a ground line, and in each of the coils, the power terminal and the ground terminal are located on a straight line through the concentric point.

17. The apparatus of claim 16, wherein the ground terminal connected to any one coil among the coils, the power terminal, and the concentric point are sequentially disposed on the straight line.

18. The apparatus of claim 16, wherein the straight line through the concentric point passes through only any one of the first portion to the n+1$^{th}$ portion in any one of the coils.

19. The apparatus of claim 16, wherein each of the first connection portion and the N−1$^{th}$ connection portion is provided to be inclined with respect to the straight line through the concentric point.

20. The apparatus of claim 1, wherein the coils are all disposed on the same plane.

* * * * *